US008045329B2

(12) United States Patent
Chen et al.

(10) Patent No.: US 8,045,329 B2
(45) Date of Patent: Oct. 25, 2011

(54) THERMAL DISSIPATION MECHANISM FOR AN ANTENNA

(75) Inventors: Kevin W. Chen, McKinney, TX (US); William P. Harokopus, McKinney, TX (US); Patrick W. Cunningham, McKinney, TX (US)

(73) Assignee: Raytheon Company, Waltham, MA (US)

( * ) Notice: Subject to any disclaimer, the term of this patent is extended or adjusted under 35 U.S.C. 154(b) by 197 days.

(21) Appl. No.: 12/432,496

(22) Filed: Apr. 29, 2009

(65) Prior Publication Data

US 2010/0277867 A1 Nov. 4, 2010

(51) Int. Cl.
*H05K 7/20* (2006.01)

(52) U.S. Cl. ......................... 361/699; 361/689; 343/872

(58) Field of Classification Search .................. 361/699, 361/689; 343/872
See application file for complete search history.

(56) References Cited

U.S. PATENT DOCUMENTS

| | | | |
|---|---|---|---|
| 3,818,983 | A | 6/1974 | Grandia |
| 4,044,396 | A | 8/1977 | Haws et al. |
| 4,057,104 | A | 11/1977 | Altoz |
| 4,493,010 | A | 1/1985 | Morrison et al. |
| 4,998,181 | A | 3/1991 | Haws et al. |
| 5,276,455 | A | 1/1994 | Fitzsimmons et al. |
| 5,423,498 | A | 6/1995 | Fluegel |
| 5,488,380 | A | 1/1996 | Harvey et al. |
| 5,570,092 | A | 10/1996 | Kohin-Nitzschelm |
| 5,930,117 | A | 7/1999 | Gengel |
| 5,960,861 | A | 10/1999 | Price et al. |
| 5,977,710 | A * | 11/1999 | Kuramoto et al. ..... 343/700 MS |
| 6,059,017 | A | 5/2000 | Sayegh |
| 6,084,772 | A | 7/2000 | Pell et al. |
| 6,377,219 | B2 | 4/2002 | Smith |
| 6,388,317 | B1 | 5/2002 | Reese |
| 6,456,224 | B1 | 9/2002 | Cobb et al. |
| 6,784,837 | B2 | 8/2004 | Revankar et al. |
| 6,937,471 | B1 | 8/2005 | Haws et al. |
| 7,017,651 | B1 | 3/2006 | Wilson et al. |
| 7,061,446 | B1 | 6/2006 | Short, Jr. et al. |
| 7,178,586 | B2 | 2/2007 | Goldman et al. |
| 7,227,753 | B2 | 6/2007 | Weber et al. |
| 7,416,017 | B2 | 8/2008 | Haws et al. |
| 7,443,354 | B2 | 10/2008 | Navarro et al. |
| 7,548,424 | B2 | 6/2009 | Altman et al. |

(Continued)

FOREIGN PATENT DOCUMENTS

EP 1 635 187 A2 3/2006

(Continued)

OTHER PUBLICATIONS

PCT Notification of Transmittal of the International Search Report and the Written Opinion of the International Searching Authority, or the Declaration, mailed Jul. 19, 2010 re PCT/US2010/031539 filed Apr. 15, 2010.

*Primary Examiner* — Anatoly Vortman
(74) *Attorney, Agent, or Firm* — Baker Botts L.L.P.

(57) ABSTRACT

According to one embodiment, a heat dissipation system includes an elongated radar absorbing member configured with a thermal dissipation mechanism. The radar absorbing member extends proximate a junction of a microwave antenna enclosure that houses an antenna and a radome that covers an opening in the microwave antenna enclosure. The radar absorbing member absorbs electro-magnetic energy incident upon the junction. The thermal dissipation mechanism absorbs heat generated by the absorbed electro-magnetic energy.

23 Claims, 2 Drawing Sheets

U.S. PATENT DOCUMENTS

| | | | | |
|---|---|---|---|---|
| 2004/0032275 | A1 | 2/2004 | Cader et al. | |
| 2004/0185906 | A1 | 9/2004 | Iwahashi et al. | |
| 2005/0190116 | A1 | 9/2005 | Syed et al. | |
| 2007/0096982 | A1 | 5/2007 | Kalian et al. | |
| 2008/0062650 | A1 | 3/2008 | Wilson et al. | |
| 2008/0106482 | A1 | 5/2008 | Cherrette et al. | |
| 2008/0150802 | A1 | 6/2008 | Kalian et al. | |
| 2009/0084527 | A1* | 4/2009 | Rummel et al. | 165/104.31 |
| 2010/0194661 | A1* | 8/2010 | Harokopus et al. | 343/872 |
| 2010/0206523 | A1* | 8/2010 | Chen et al. | 165/104.33 |

FOREIGN PATENT DOCUMENTS

| | | | | |
|---|---|---|---|---|
| GB | 870917 | | | 6/1961 |
| JP | 10051213 | A | * | 2/1998 |
| JP | 2003298270 | A | * | 10/2003 |

* cited by examiner

THERMAL DISSIPATION MECHANISM FOR AN ANTENNA

TECHNICAL FIELD OF THE DISCLOSURE

This disclosure generally relates to antennas, and more particularly, to a thermal dissipation mechanism that may be used to absorb heat from a radar absorbing member of an antenna.

BACKGROUND OF THE DISCLOSURE

Antennas operating in the microwave frequency range use various directing or reflecting elements with relatively precise physical characteristics. To protect these elements, a protective covering commonly referred to as a radome may be placed over the antenna. The radome separates the elements of the antenna from various environmental aspects, such as precipitation, humidity, solar radiation, or other forms of debris that may compromise the performance of the antenna.

SUMMARY OF THE DISCLOSURE

According to one embodiment, a heat dissipation system includes an elongated radar absorbing member configured with a thermal dissipation mechanism. The radar absorbing member extends proximate a junction of a microwave antenna enclosure that houses an antenna and a radome that covers an opening in the microwave antenna enclosure. The radar absorbing member absorbs electro-magnetic energy incident upon the junction. The thermal dissipation mechanism absorbs heat generated by the absorbed electro-magnetic energy.

Some embodiments of the disclosure may provide numerous technical advantages. For example, one embodiment of the radar absorbing member configured with the thermal dissipation mechanism may allow increased output power density levels than may be provided by known radar absorbing member designs. Radar absorbing members are often used with radomes of microwave antennas to reduce its effective radar cross-section (RCS), reduce electro-magnetic interference, and/or improve the antenna's pattern. Because these radar absorbing members inherently absorb electro-magnetic radiation, they may limit the transmitted output power density generated by the microwave antenna. In some embodiments, the thermal dissipation mechanism actively cools the radar absorbing member during operation; thus, the output power density level generated by the microwave antenna may be increased without causing excessive heating of the radar absorbing member and/or other components adjacent to the radar absorbing member, such as the radome configured on the microwave antenna.

Some embodiments may benefit from some, none, or all of these advantages. Other technical advantages may be readily ascertained by one of ordinary skill in the art.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

Antennas used to propagate electro-magnetic radiation in the microwave frequency ranges are often covered with radomes for protection from damage due to operation in uncontrolled environments. For antennas having multiple radiating elements that operate in the microwave frequency range, radomes may be positioned over an opening of the microwave antenna enclosure such that electro-magnetic radiation passes through freely while shielding its relatively delicate elements and associated electronics from the ambient environment. Thus, radomes may typically include low radio-frequency (RF) loss materials to not unduly affect the radiation pattern of the antenna.

The transparency of some antennas to enemy radar, such as those used in military applications may be important. Although radomes may provide relatively good protection, their constituent materials may form an electrical discontinuity with adjacent antenna enclosures that house their respective antennas. The junction at the edge of the radome may be used to reduce the electro-magnetic interference (EMI) contribution to other co-located antennas by reducing the electro-magnetic energy trapped in the radome. It can also improve antenna pattern by reducing scattered contributions to side-lobe levels. It can also be used to reduce its radar cross-section (RCS). To remedy this problem, the junction may be covered by a radar absorbing material to absorb electro-magnetic radiation incident upon the junction. This radar absorbing material, however, may trap a significant amount of heat when used in conjunction with antennas that generate relatively high output power density signals.

Figure 1A:
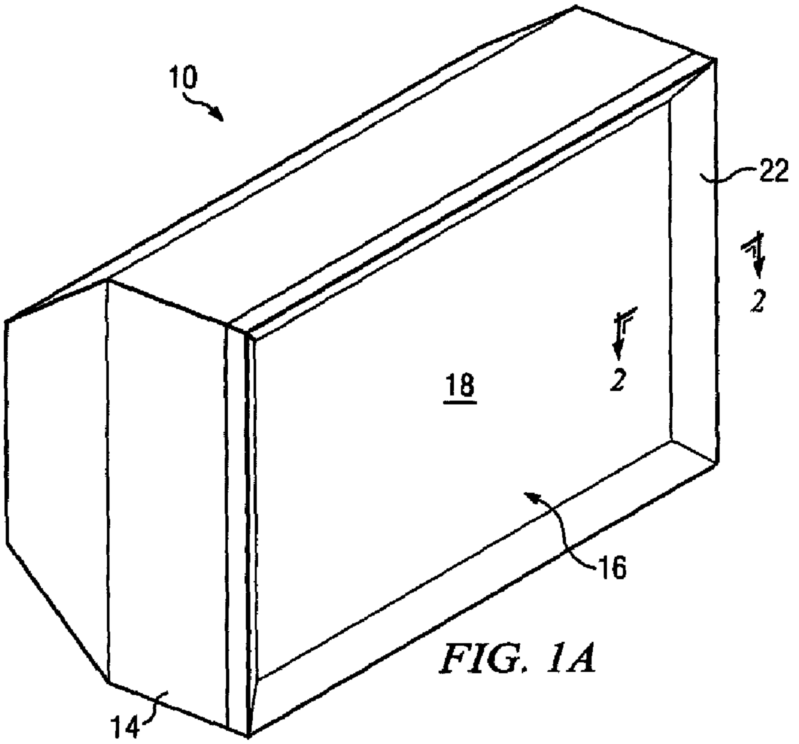
FIGS. 1A and 1B are perspective and cross-sectional, side elevational views, respectively, of a microwave antenna that include an embodiment of a radar absorbing member having a thermal dissipation mechanism.
Figure 1B:
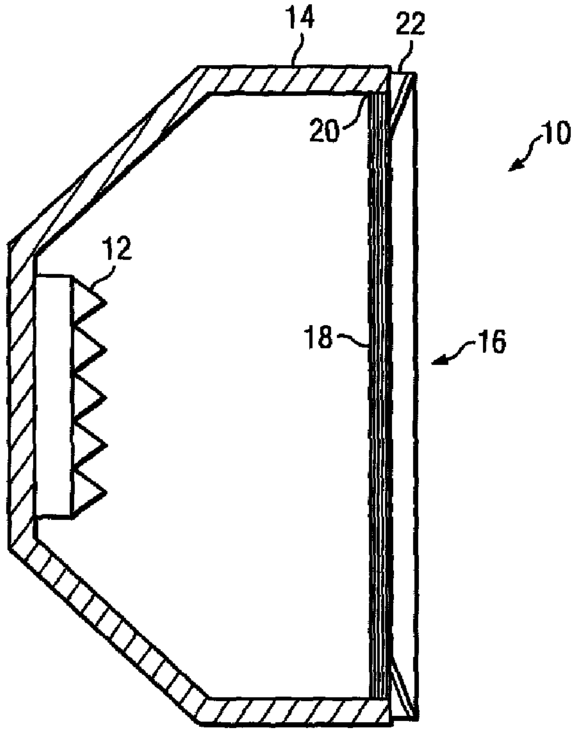

FIGS. 1A and 1B show one embodiment of a microwave antenna 10 that may benefit from the teachings of the present disclosure. Microwave antenna 10 includes one or more radiating elements 12 (FIG. 1B) that are housed in an enclosure 14. Enclosure 14 has an opening 16 that is covered by a radome 18. The interface of enclosure 14 and radome 18 forms a junction 20 that is covered by a radar absorbing member 22. According to the teachings of the present disclosure, radar absorbing member 22 is configured with a thermal dissipation mechanism that removes heat from radar absorbing member 22 due to the transmission of electro-magnetic radiation by radiating elements 12.

Radiating elements 12 may be any type of physical structure that transmits and/or receives electro-magnetic radiation. Radiating elements 12 transmit electro-magnetic radiation with an output power density that may cause heat build-up inside radar absorbing member 22. In some cases, radiating elements 12 generate electro-magnetic radiation having an output power density that is greater than 5 Watts per square inch ($W/in^2$) and may sometimes be many Watts per square inch ($W/in^2$). Electro-magnetic radiation at these output power density levels may cause excessive heating within the radar absorbing member 22. In some cases, the radar absorbing member 22 may be helpful in improving the antenna performance or radar cross-section (RCS).

Although the radar absorbing member 22 may be useful for enhancing the transparency of microwave antenna 10 from detection by radar, its electro-magnetic absorbing characteristic also absorbs electro-magnetic radiation generated by radiating elements 12. Because radar absorbing member 22 may be made of a generally thermally insulative material, it may experience excessive heat build-up when radiating elements 12 transmit electro-magnetic radiation. In some cases, this excessive heat build-up in radar absorbing member 22 may cause various types of damage to radome 18, such as delamination of the various layers of radome 18 from one another.

Figure 2:
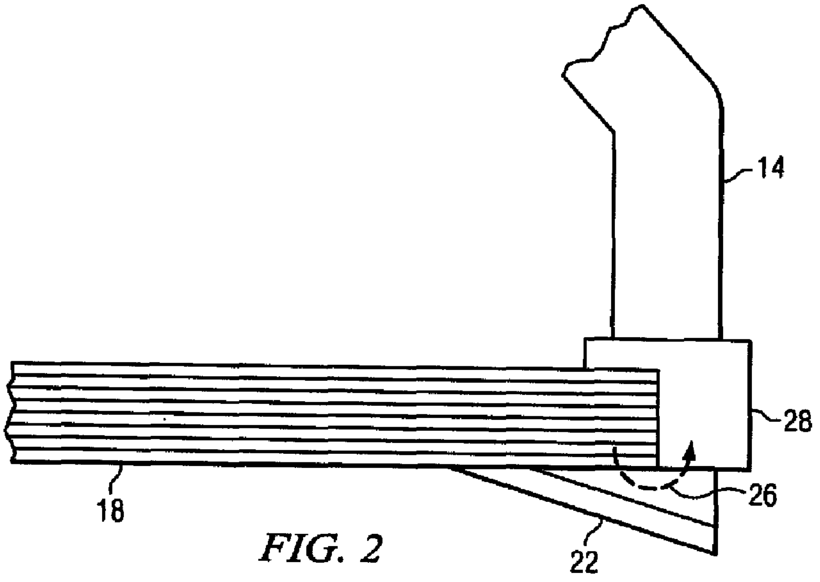
FIG. 2 is an enlarged, cross-sectional view of the microwave antenna as shown along the lines 2 to 2 of FIG. 1B in which one embodiment of a thermal dissipation mechanism according to the teachings of the present disclosure that thermally couples the radar absorbing member to the microwave antenna enclosure.

FIG. 2 is an enlarged, cross-sectional view of one embodiment of a thermal spreader 26 that may be configured in radar absorbing member 22. In this particular embodiment, thermal spreader 26 is a type of thermal dissipation mechanism that may be disposed within radar absorbing member 22. Thermal spreader 26 is thermally coupled to radar absorbing member 22 and a support frame 28 configured on antenna enclosure 14 that may be used for attachment and support of radome 18 on enclosure 14. Thermal spreader 26 is formed of a thermally conductive material to conduct heat away from radar absorbing member 22. In this particular embodiment, support frame 28 is made of a thermally conductive material, such as metal, that readily conducts heat away from radar absorbing member 22.

Thermal spreader 26 may be thermally coupled to support frame 28 using any suitable approach. In one embodiment, thermal spreader 26 is maintained in physical contact with radar absorbing member 22 and support frame 28 using fasteners, such as bolts, or a suitable adhesive. In one embodiment, thermal coupling may be enhanced by a relatively thin layer of heat transfer compound, such as a ceramic-based thermal grease or a metal-based thermal grease that is sandwiched between thermal spreader 26 and support frame 28 and/or radar absorbing member 22.

Thermal spreader 26 may be made of any suitable type of material. In one embodiment, thermal spreader 26 is made of a metal, such as aluminum, that has a relatively high degree of thermal conductivity. In another embodiment, thermal spreader 26 has a shape that does not unduly affect the propagation pattern of antenna elements 12 or adversely affect the transparency of microwave antenna 10 to radar detection. Examples of suitable materials for this purpose may include, aluminum, copper, chemical vapor deposition (CVD) diamond, pyrolytic graphite, K-1100 carbon fibers and copper infiltrated carbon fibers.

Figure 3:
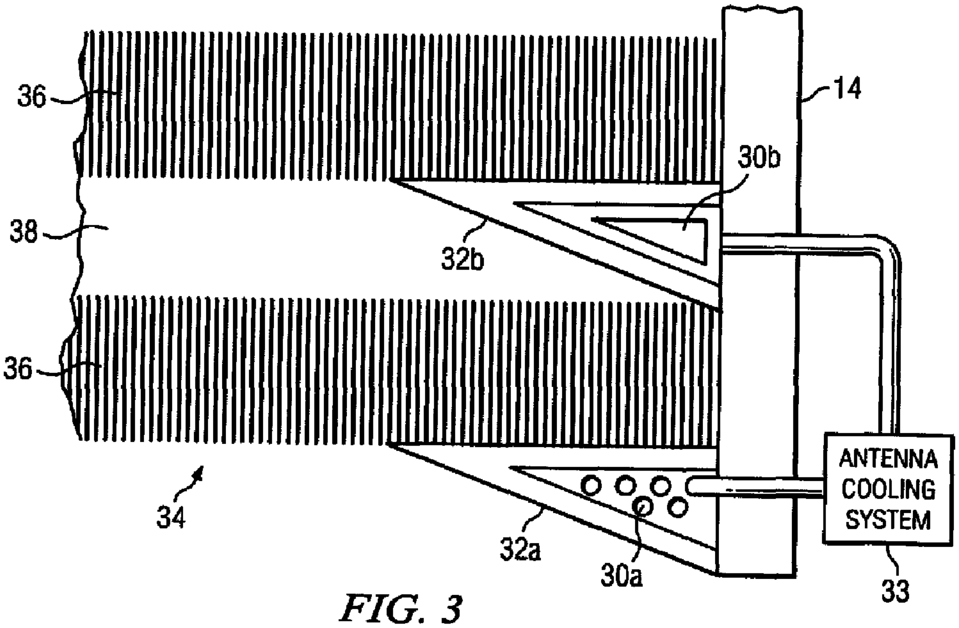
FIG. 3 is an enlarged, cross-sectional view of the microwave antenna as shown along the lines 2 to 2 of FIG. 1B in which another embodiment of a thermal dissipation mechanism including one or more hollow tubes that are configured to convey a fluid coolant that absorbs heat from the radar absorbing members.

FIG. 3 is an enlarged, cross-sectional view of microwave antenna 10 incorporating an alternative embodiment of a thermal dissipation mechanism according to the teachings of the present disclosure. In this particular embodiment, thermal dissipation mechanism includes one or more elongated hollow tubes 30*a* and 30*b* that convey a fluid coolant through corresponding radar absorbing members 32*a* and 32*b*. Hollow tubes 30*a* and 30*b* are fluidly coupled to an antenna cooling system 33 that cools the fluid coolant that has been heated by hollow tubes 30*a* and 30*b*. Hollow tubes 30*a* and 30*b* have an elongated extent that may extend through a portion or through the entire length of their associated elongated radar absorbing members 32*a* and 32*b*. Radome 34 as shown is a layered radome 34 having several core layers 36 alternatively disposed over a laminate layer 38 in which radar absorbing member 32*b* is disposed within the laminate layer 38. In other embodiments, hollow tubes 30*a* and 30*b* may be configured in radar absorbing members 32*a* and 32*b* for use on any suitable type of radome having multiple layers as shown or on the radome 18 configuration as shown in FIG. 2.

Multiple relatively small hollow tubes 30*a* or a relatively larger, single hollow tube 30*b* may be used to convey fluid coolant through radar absorbing member 22. Hollow tubes 30*a* and 30*b* may have any suitable type of cross-sectional shape. In the particular embodiment shown, hollow tubes 30*a* have a generally circular cross-sectional shape while the single hollow tube 30*b* has a cross-sectional shape that is generally similar to the shape of radar absorbing member 22, which in this particular case is triangular in shape.

In operation, a fluid coolant flows through hollow tubes 30*a* and 30*b* to absorb heat generated inside radar absorbing member 22. This fluid coolant may operate as a two-phase fluid coolant in which the coolant enters hollow tubes 30*a* and 30*b* in liquid form and boils or vaporizes such that some or all of the fluid coolant leaves the hollow tubes 30*a* and 30*b* as a vapor. In other embodiments, the fluid coolant may operate as a single-phase coolant in which the coolant enters hollow tubes 30*a* and 30*b* as a liquid, increases in temperature, and exits again in all or mostly liquid form.

Heat absorbed by the fluid coolant may be removed in any suitable manner. In one embodiment, movement of the fluid coolant through hollow tubes 30*a* and 30*b* may be provided by convection. That is, the heating of fluid coolant within radar absorbing member 22 causes its movement to another location where it may be cooled. In this case, hollow tubes 30*a* and 30*b* may be thermally coupled to radar enclosure 14 for cooling of the fluid coolant. In the particular embodiment shown, hollow tubes 30*a* and 30*b* are coupled to antenna cooling system 33 that is also used to remove heat from other portions of microwave antenna 10. For example, antenna cooling system 33 may be configured to receive heated fluid coolant from an electrical circuit that is used to generate electro-magnetic energy through antenna elements 12.

The fluid coolant used in the embodiment of FIG. 3 may include, but is not limited to, freon, polyalphaolefin, a mixture of ethylene glycol and water, a mixture of propylene glycol and water, a fluorinert and a range of isomers of an alkylated aromatic. In other embodiments, the liquid may be a perfluorocarbon, such as octafluoropropane, perfluorohexane, or perfluorodecalin. These perfluorocarbons are relatively inert and generally electrically insulative making them well suited for use around microwave antenna 10.

Modifications, additions, or omissions may be made to microwave antenna 10 without departing from the scope of the invention. The components used to make radar absorbing member 22 may be integrated or separated. For example, hollow tubes 30*a* and/or 30*b* may be integrally formed with radar absorbing member 22 in which they are made of the same material from which radar absorbing material is made. Moreover, the operations of the thermal dissipation mechanism may be performed by more, fewer, or other components. For example, antenna cooling system 33 may also include a thermometer that is coupled to radar absorbing member 22 for monitoring its operating temperature and thus, controlling its operating temperature within a specified range. As used in this document, “each” refers to each member of a set or each member of a subset of a set.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

What is claimed is:

1. A microwave transmission system comprising:

a microwave antenna enclosure;

a radome that covers an opening in the microwave antenna enclosure, the microwave antenna enclosure and the radome made of differing materials such that an electrical discontinuity is formed at a junction of the microwave antenna enclosure and the radome;

an elongated radar absorbing member extending proximate the junction, the radar absorbing member operable to absorb electro-magnetic energy incident upon the junction; and one or more hollow tubes operable to convey a coolant through the elongated radar absorbing member, the one or more hollow tubes fluidly coupled to a cooling system of a microwave antenna configured in the microwave antenna enclosure having one or more radiating elements, the cooling system operable to remove heat from the radiating elements and the radar absorbing member.

2. A heat dissipation system comprising:

an elongated radar absorbing member extending proximate a junction of a microwave antenna enclosure and a radome that covers an opening in the microwave antenna enclosure, the microwave antenna enclosure and the radome made of differing materials such that an electrical discontinuity is formed at the junction, the radar absorbing member operable to absorb electro-magnetic energy incident upon the junction; and a thermal dissipation mechanism configured in the elongated radar absorbing member and operable to remove heat away from the elongated radar absorbing member, wherein the thermal dissipation mechanism comprises one or more hollow tubes that are operable to convey a coolant through the elongated radar absorbing member for removing heat from the elongated radar absorbing member.

3. The heat dissipation system of claim 2, wherein the coolant is operable to be conveyed through the one or more hollow tubes using a convective action of the coolant.

4. The heat dissipation system of claim 2, wherein the coolant is operable to be conveyed through the one or more hollow tubes using a pump.

5. The heat dissipation system of claim 2, wherein the one or more hollow tubes are fluidly coupled to a cooling system of a microwave antenna configured in the microwave antenna enclosure having one or more radiating elements, the cooling system operable to remove heat from the radiating elements and the radar absorbing member.

6. The heat dissipation system of claim 2, wherein the one or more hollow tubes are thermally coupled to a support frame of the microwave antenna enclosure such that the support frame receives heat from the one or more hollow tubes.

7. The heat dissipation system of claim 2, wherein the one or more tubes have a circular cross-sectional shape.

8. The heat dissipation system of claim 2, wherein the one or more hollow tubes comprises a single tube having a cross-sectional shape generally similar to the cross-sectional shape of the radar absorbing member.

9. The heat dissipation system of claim 8, wherein the radar absorbing member has a wedge cross-sectional shape.

10. The heat dissipation system of claim 2, wherein the antenna is operable to generate the electro-magnetic energy having a power density greater than 5 Watts per square inch.

11. The heat dissipation system of claim 2, wherein the thermal dissipation mechanism comprises a thermally conductive material that thermally couples the elongated radar absorbing member to the microwave antenna enclosure.

12. The heat dissipation system of claim 11, wherein the thermally conductive material comprises a metallic material.

13. A microwave transmission system comprising:

a microwave antenna enclosure;

a radome that covers an opening in the microwave antenna enclosure, the microwave antenna enclosure and the radome made of differing materials such that an electrical discontinuity is formed at a junction of the microwave antenna enclosure and the radome;

an elongated radar absorbing member extending proximate the junction, the radar absorbing member operable to absorb electro-magnetic energy incident upon the junction; and a thermal dissipation mechanism configured in the elongated radar absorbing member and operable to remove heat away from the elongated radar absorbing member, wherein the thermal dissipation mechanism comprises one or more hollow tubes that are operable to convey a coolant through the elongated radar absorbing member for removing heat from the elongated radar absorbing member.

14. The microwave transmission system of claim 13, wherein the thermal dissipation mechanism comprises a thermally conductive material that thermally couples the elongated radar absorbing member to the microwave antenna enclosure.

15. The microwave transmission system of claim 14, wherein the thermally conductive material comprises a metallic material.

16. The microwave transmission system of claim 13, wherein the coolant is operable to be conveyed through the one or more hollow tubes using a convective action of the coolant.

17. The microwave transmission system of claim 13, wherein the coolant is operable to be conveyed through the one or more hollow tubes using a pump.

18. The microwave transmission system of claim 13, wherein the one or more hollow tubes are fluidly coupled to a cooling system of a microwave antenna configured in the microwave antenna enclosure having one or more radiating elements, the cooling system operable to remove heat from the radiating elements and the radar absorbing member.

19. The microwave transmission system of claim 13, wherein the one or more hollow tubes are thermally coupled to a support frame of the microwave antenna enclosure such that the support frame receives heat from the one or more hollow tubes.

20. The microwave transmission system of claim 13, wherein the one or more tubes have a circular cross-sectional shape.

21. The microwave transmission system of claim 13, wherein the one or more hollow tubes comprises a single tube having a cross-sectional shape generally similar to the cross-sectional shape of the radar absorbing member.

22. The microwave transmission system of claim 21, wherein the radar absorbing member has a wedge cross-sectional shape.

23. The microwave transmission system of claim 13, wherein the antenna is operable to generate the electro-magnetic energy having a power density greater than 5 Watts per square inch.

* * * * *